United States Patent [19]

Holyman et al.

[11] 4,417,220

[45] Nov. 22, 1983

[54] ADJUSTABLE AND SELECTIVE ELECTRICAL FILTERS AND METHODS OF TUNING THEM

[75] Inventors: Brian T. Holyman; Charlton R. Baty, both of London, England

[73] Assignee: Decca Limited, London, England

[21] Appl. No.: 232,180

[22] Filed: Feb. 6, 1981

[30] Foreign Application Priority Data

Feb. 11, 1980 [GB] United Kingdom ................. 8004490

[51] Int. Cl.³ .................. H03H 7/07; H03H 7/09; H03H 11/04; H03B 5/26
[52] U.S. Cl. .................................. 333/174; 328/167; 331/138; 333/171
[58] Field of Search ........................ 333/167, 169–172, 333/174–178, 17 R; 328/167, 138, 165; 331/138–142; 330/109, 292, 302; 324/78 F, 78 Z

[56] References Cited

U.S. PATENT DOCUMENTS

| | | | |
|---|---|---|---|
| 3,072,868 | 1/1963 | Lucka et al. | 333/171 |
| 3,193,774 | 7/1965 | Clapper | 330/294 |
| 3,193,777 | 7/1965 | Carter et al. | 331/141 X |
| 3,249,876 | 5/1966 | Harrison | 331/36 C |
| 3,535,649 | 10/1970 | Szabo | 333/170 X |
| 3,684,977 | 8/1972 | Viles | 333/17 X |
| 3,838,351 | 9/1974 | Hekimian | 330/103 X |

FOREIGN PATENT DOCUMENTS

| | | |
|---|---|---|
| 989431 | 4/1965 | United Kingdom . |
| 1027621 | 4/1966 | United Kingdom . |
| 1071204 | 6/1967 | United Kingdom . |
| 1264945 | 2/1972 | United Kingdom . |
| 1294459 | 10/1972 | United Kingdom . |

*Primary Examiner*—Marvin L. Nussbaum
*Attorney, Agent, or Firm*—Kenyon & Kenyon

[57] ABSTRACT

A notch filter is provided with an ancillary circuit including a non-inverting amplifier and a coupling which enables the filter to form part of an oscillatory loop of which the frequency of oscillation corresponds to the frequency of maximum rejection by the notch filter. Measurement of that frequency facilitates the tuning of the notch filter, which includes capacitors constituted by varactor diodes. The gain of the ancillary circuit may be adjusted to change its mode of operation from oscillation to that of a tuned amplifier so that a sweep of the center frequency of the notch filter through a range of interest facilitates a search for an unknown interfering frequency and the simultaneous tuning of the notch filter to reject that interference.

8 Claims, 3 Drawing Figures

ADJUSTABLE AND SELECTIVE ELECTRICAL FILTERS AND METHODS OF TUNING THEM

BACKGROUND TO THE INVENTION

This invention relates to electrical filters which have band selective transfer characteristics and which can be adjusted to alter the stop-band or pass-band. The invention particularly though not exclusively concerns the tuning or narrow-band rejection filters such as notch filters.

One example of the use to which a particular form of the invention may be put is the tuning of a radio navigational receiver to provide the greatest possible attenuation of signals at a particular, adjustable, frequency. Notch filters, that is to say narrow-band rejection filters, are often used to eliminate, or at least severely attenuate, interference which occurs at a particular frequency or within a narrow band of frequencies. Often the receiver's operator knows in advance the frequency of likely interference; nevertheless, it has proved difficult to provide a satisfactory means by which the notch filter can be adjusted to provide maximum rejection of signals at the interference frequency. One object of the present invention is to reduce that difficulty. The invention may have a wider utility, in particular in the tuning of a narrow-band pass filter.

SUMMARY OF THE INVENTION

In its usual form, the invention subsists in an electrical wave filter which has a shiftable narrow bandwidth and which is associated with a regenerative circuit operable independently of reception of signals by the filter, and a coupling, which couples the filter into the said regenerative circuit to cause the circuit to exhibit maximum gain, or oscillation, within the said bandwidth. The filter may be a notch filter or other filter having a narrow band-stop transfer characteristic and may be constituted by a bridged-T filter of which series capacitors are constituted by varactor diodes of which a bias is adjusted to alter the frequency at which maximum rejection of signals occurs. The coupling may include a transformer of which a primary winding in combination with the other reactive elements of the filter, such as the aforementioned varactor diodes, determines the frequency response of the filter and of which the secondary winding, which provides a stepped-down ratio, is coupled to an amplifier of high input impedance so that the loading of the secondary does not significantly affect the frequency response of the filter for forward transmission of signals. The amplifier may constitute the active element in the regenerative circuit.

It will be apparent from the following description that the arrangement described facilitates the measurement of the frequency at which maximum rejection of signals by a notch filter occurs and thereby facilitates the proper tuning of the filter either to a particular desired frequency or to a previously unknown frequency at which interference occurs in order to provide maximum rejection of that interference.

It will be appreciated by those skilled in the art that the disposition of a notch filter in the feedback loop of an amplifier is a commonplace expedient for producing an oscillatory circuit of which the frequency of oscillation is determined by the frequency for which the notch filter provides maximum rejection. The present invention employs, at least in a particular embodiment, in essence the same principle of operation as such a circuit; but one significance of the present invention lies in the provision of means by which an adjustable notch filter or other adjustable filter of narrow bandwidth can be tuned with the aid of a precise measurement of the actual response of the filter.

BRIEF DESCRIPTION OF THE ACCOMPANYING DRAWINGS

DESCRIPTION OF THE PREFERRED EMBODIMENTS

Figure 1:
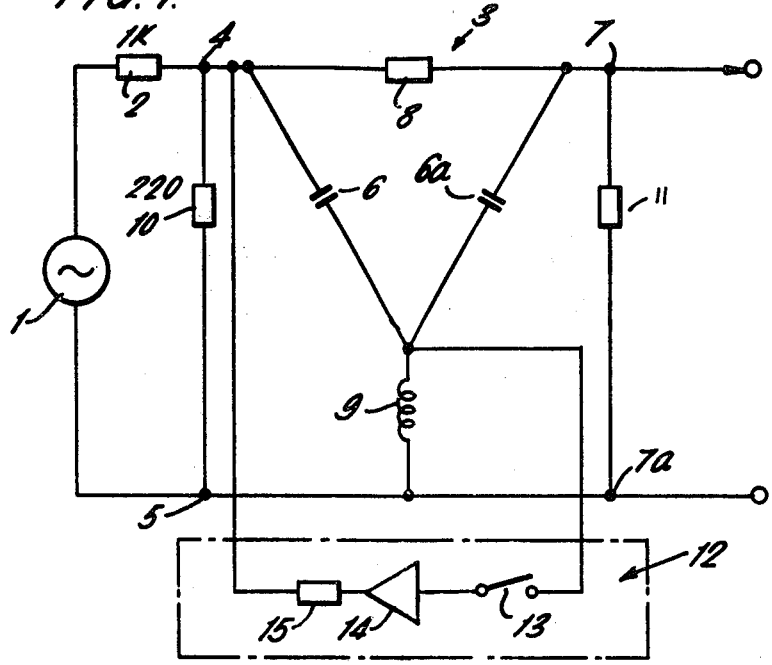
FIG. 1 is an explanatory diagram of a notch filter associated with an ancillary active circuit.

In FIG. 1 is shown a signal source represented by an oscillator 1 and a resistive impedance 2; the source may be constituted by a pre-amplifier connected to an antenna in a radio navigational receiver. The source feeds a notch filter 3 which is in typical form. In FIG. 1 the notch filter has a pair of input terminals 4 and 5 and a pair of output terminals 7 and 7a. The filter is a bridged-T filter comprising a series branch of two capacitors 6 and 6a bridged by a resistor 8 between the terminals 4 and 7; a shunt inductor connects the junction between the capacitors 6 and 6a to a common point between the terminals 5 and 7a. The input terminals are connected by a shunt resistor 10 and the output terminals are connected by a load resistor 11. Such a notch filter provides narrow band rejection of signals from the source; maximum rejection of signals occurs at a particular frequency which can be shifted by adjustment of the capacitors 6 and 6a.

In order to ascertain the frequency to which the notch filter is tuned, an ancillary circuit 12 may be used. This circuit is, for example, connected between the common junction of the capacitors 6 and 6a and that between inductor 9 and the input terminal 4 and comprises, for example, a switch 13, a non-inverting amplifier 14 and an output resistor 15. For normal operation of the notch filter, the switch 13 would be open. For testing the filter to ascertain the frequency at which maximum rejection occurs, the switch 13 would be closed, whereupon the circuit into which the notch filter is coupled produces a sinusoidal oscillation at the aforementioned frequency of maximum rejection. The frequency of the oscillation can be measured by any suitable frequency meter; the notch filter can then be adjusted until the measured frequency of oscillation corresponds exactly to the frequency for which maximum rejection of signals by the notch filter is required.

It is very desirable that the coupling of the notch filter into the ancillary circuit should not affect the frequency response of the notch filter and that the ancillary circuit should not have any uncompensated phase shift, else the oscillatory frequency and the frequency of maximum rejection by the notch filter will differ and render the measurement of the frequency of maximum rejection inaccurate.

Figure 2:
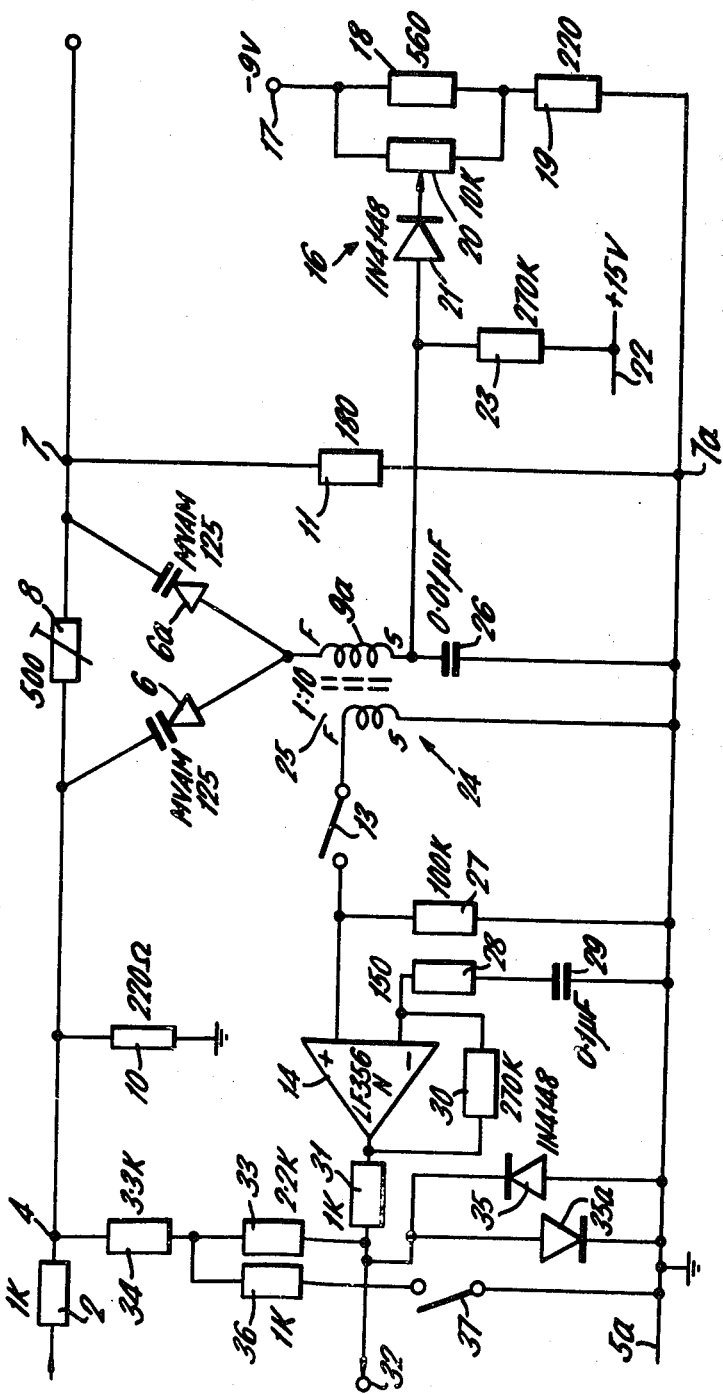
FIG. 2 illustrates one embodiment of the invention.

FIG. 2 illustrates a circuit which incorporates the circuit arrangement shown in FIG. 1. In this circuit the capacitors 6 and 6a are now ganged variable capacitors constituted by varactor diodes 6 and 6a respectively. An adjustable bias for the varactor diodes is provided by a circuit 16. This circuit has a voltage supply provided between a negative terminal 17 and the terminal 7a, which is jointly earthed with the input terminal 5a, corresponding to the terminal 5. Between the terminals 17 and 7a is a voltage divider constituted by resistors 18 and 19 of which resistor 18 is shunted by potentiometer 20. The tap of the potentiometer 20 is connected by way of a blocking diode 21 to a positive terminal 22 by way of a resistor 23 and also to the varactor diodes 6 and 6a by way of a primary winding 9a of a transformer 24 of which the secondary 25 couples the notch filter to the ancillary circuit which will be described later.

The winding 9a corresponds in essence to the winding 9 in FIG. 1 whereas the capacitor 26 is provided only to maintain bias on the varactor diodes while constituting a short circuit to signals at any frequency within the range of operation of the notch filter.

The secondary winding 25 of the transformer 24 is in essence loosely coupled to the primary winding 9a and provides a stepped down ratio of, for example, 10 to 1. This coupling ensures that the ancillary circuit, which has a high input impedance, has little effect on the frequency response of the notch filter. For example, the input impedance of the ancillary circuit may be of the order of 100 kilohms and the impedance reflected into the transformer is accordingly very high whether the switch 13 is closed or not.

The amplifier 14 is constituted by an operational amplifier of very high input impedance. The actual impedance which is presented to the secondary winding 25 when the switch 13 is closed is substantially that of a shunt resistor 27 connected between earth and the positive input terminal of the amplifier. The inverting input terminal is connected to earth by way of resistor 28 and a capacitor 29 and to the output terminal of the amplifier by way of a feedback resistor 30. The output of the amplifier is connected by way of a resistor 31 to an output terminal 32. The loop consisting of the filter and the ancillary circuit is completed by resistors 33 and 34 connected between the resistor 31 and the terminal 4. Two diodes 35 and 35a, disposed with opposite polarities, are connected between the terminal 32 and the earth terminal in order to limit the output of the amplifier 14 to, approximately, half a volt on each side of zero potential. For a purpose to be described later, the junction of the resistors 33 and 34 is connected by way of a resistor 36 and a switch 37 to the earth terminal 5a. The circuit described with reference to FIG. 2 includes only one notch filter but it is quite practical to modify the circuit, with the provision of sufficient switches, so that the ancillary circuit can be used for any one of a set of notch filters disposed in parallel.

For normal operation of the notch filter, the switches 13 and 37 are open. If it be desired to tune the filter to a particular, predetermined, frequency, the switch 13 is closed. The closed loop then formed by the amplifier 14 and its associated components and the filter is oscillatory at the frequency of maximum rejection of the notch filter. This frequency can be measured by any suitable frequency meter coupled to the output terminal 32. The potentiometer 20 can then be adjusted until the measured frequency corresponds exactly to the desired frequency.

The closure of the switch 37 causes a reduction in the loop gain of the regenerative circuit which is constituted principally by the amplifier 14 and the notch filter. The combined circuit then acts as a tuned amplifier which has a peak response at the frequency for which, in normal operation, the notch filter provides maximum rejection. The modification of the response of the regenerative circuit in this manner enables an operator to search for interference which occurs at or about a particular, though unknown, frequency. In order to make the search, the filter must be adjusted, for example by means of the potentiometer 20, to sweep through the pass-band of the receiver until the interference is found. The notch filter is thereby automatically set to reject that interference.

Figure 3:
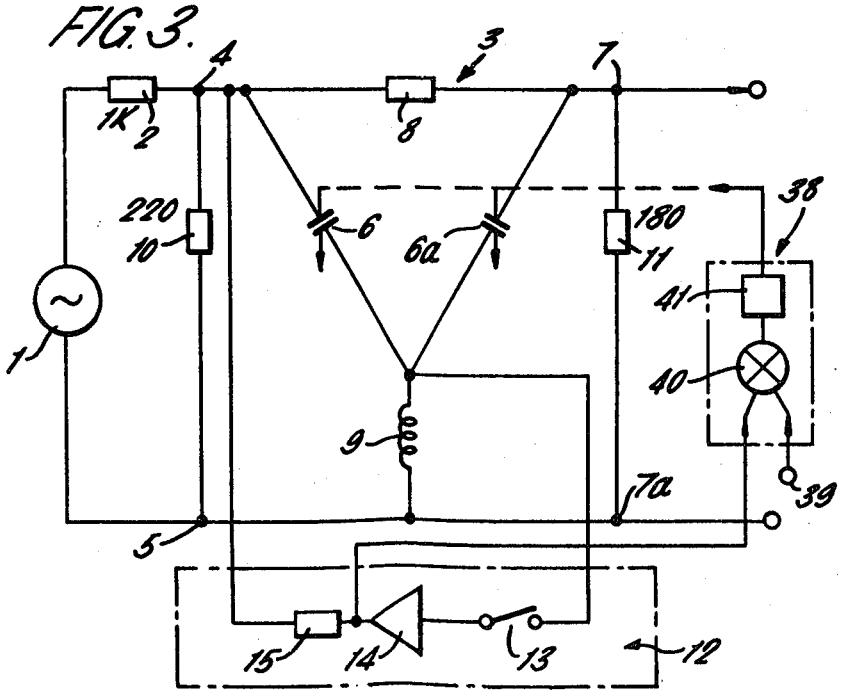
FIG. 3 illustrates a modification which provides automatic tuning.

FIG. 3 illustrates a circuit which permits automatic tuning. The circuit is shown as a modification of FIG. 1 for simplicity but in essence the modification is the addition of a circuit 38 in place of the manually adjustable circuit 16 in FIG. 2.

In the modified circuit, a signal at the frequency which should be rejected is applied to a terminal 39 of a frequency comparator 40 which compares this reference signal with the signal which is induced in the oscillatory circuit; the difference is fed through a low-pass amplifier 41 to adjust the bias for the varactor diodes 6, 6a until the filter is tuned to the desired frequency.

We claim:

1. An electrical filter which has a normal operational mode in which it provides narrow-band rejection of signals centered on an adjustable frequency and a test mode in which it provides amplification of signals at said frequency, the electrical filter comprising:
   (a) a filter network having a narrow band rejection characteristic centered on a particular frequency and including adjustable means for altering said frequency;
   (b) an ancilliary network including an amplifier; and
   (c) means for completing a circuit which includes said ancilliary network and at least part of said filter network, said means for completing permitting said electrical filter to function in said normal operational mode and in said test mode.

2. An electrical filter as set forth in claim 1 in which said filter network includes a T network having series elements and a shunt element, said shunt element comprising an inductor, and said means for completing includes a step down transformer having a primary winding constituted by said inductor.

3. An electrical filter which has a normal operational mode in which it provides narrow-band rejection of signals centered on an adjustable frequency and a test mode in which it provides amplification of signals at said frequency, the electrical filter comprising:
   (a) a notch-rejection filter network having a forward transfer characteristic centered on a particular frequency and including adjustable means for adjusting said frequency;
   (b) an ancilliary network including an amplifier; and
   (c) switch means for completing a circuit which includes said ancilliary network and at least part of said filter network, said switch means permitting selectively operation of said filter network in said normal operational mode and operation of said filter network in said test mode; and means for adjusting the gain of said amplifier whereby said circuit has a first test mode functioning as a tuned amplifier and a second test mode functioning as an oscillator.

4. An electrical filter which has a normal operational mode in which it provides narrow band rejection of signals centered on an adjustable frequency and a test mode in which it provides amplification of an output signal at said frequency, the electrical filter comprising:

(a) a filter network having a narrow-band rejection characteristic centered on a particular frequency and including means for adjusting said frequency;
(b) an ancilliary network including an amplifier;
(c) means for completing a circuit which includes said ancilliary network and at least part of said filter network, said means for completing permitting said electrical filter to operate both in said normal mode and in said test mode; and
(d) an automatic tuner for comparing the frequency of the said output signal with the frequency of a reference signal and for controlling said means for adjusting to tune the said filter network to the frequency of the reference signal.

5. An electrical filter as set forth in claim 4 in which said filter network includes series capacitors of which at least one is constituted by a varactor diode, the means for adjusting comprising means for varying a bias on said diode.

6. An electrical filter comprising:
a bridged-T filter network having a notch rejection transfer characteristic centered on a notch frequency and comprising an input port, an output port, two capacitors in series between said input port and said output port, a shunt branch connected conjointly to said capacitors and a resistive branch bridging said capacitors;
a step-down voltage transformer comprising a primary winding, constituting at least part of said shunt branch of said filter network, and a secondary winding;
means for electrically adjusting said capacitors to shift the notch frequency of the transfer characteristic of said filter network;
a non-inverting amplifier; and
means including a switch for completing a closed loop, including said filter network and extending from said secondary winding to said input port by way of said amplifier.

7. A filter according to claim 6 further comprising switch means for adjusting the gain of the amplifier.

8. A filter according to claim 6 further comprising means for comparing a reference frequency with a frequency of oscillation in said closed loop and for controlling said adjusting means to tune said network to said reference frequency.

* * * * *